United States Patent
Takahashi et al.

(10) Patent No.: US 9,520,276 B2
(45) Date of Patent: Dec. 13, 2016

(54) ELECTRODE ASSEMBLY AND PLASMA PROCESSING APPARATUS

(75) Inventors: Chikako Takahashi, Kurokawa-gun (JP); Takashi Suzuki, Sendai-shi (JP); Masato Horiguchi, Kurokawa-gun (JP); Takashi Yamamoto, Kurokawa-gun (JP)

(73) Assignee: Tokyo Electron Limited, Tokyo (JP)

( * ) Notice: Subject to any disclaimer, the term of this patent is extended or adjusted under 35 U.S.C. 154(b) by 912 days.

(21) Appl. No.: 13/437,647

(22) Filed: Apr. 2, 2012

(65) Prior Publication Data

US 2012/0247678 A1 Oct. 4, 2012

Related U.S. Application Data

(63) Continuation-in-part of application No. 11/453,140, filed on Jun. 15, 2006, now abandoned.
(Continued)

(30) Foreign Application Priority Data

Jun. 22, 2005 (JP) ................................. 2005-182479

(51) Int. Cl.
*H01L 21/00* (2006.01)
*H01J 37/32* (2006.01)
*H01L 21/683* (2006.01)

(52) U.S. Cl.
CPC .... *H01J 37/32633* (2013.01); *H01J 37/32009* (2013.01); *H01J 37/3244* (2013.01);
(Continued)

(58) Field of Classification Search
CPC .................................................. H01J 37/32697
(Continued)

(56) References Cited

U.S. PATENT DOCUMENTS 5,074,456 A 12/1991 Degner et al.
5,250,137 A * 10/1993 Arami et al. ............ 156/345.44
(Continued)

FOREIGN PATENT DOCUMENTS

JP    8-330405      12/1996
JP    2001127046 A   5/2001
(Continued)

OTHER PUBLICATIONS

Office Action mailed Mar. 31, 2009, in co-pending U.S. Appl. No. 11/453,140.
(Continued)

*Primary Examiner* — Sylvia R MacArthur
*Assistant Examiner* — Anna Crowell
(74) *Attorney, Agent, or Firm* — Oblon, McClelland, Maier & Neustadt, L.L.P.

(57) ABSTRACT

An electrode assembly of a plasma processing apparatus that enables damage to an electrode plate to be prevented, and enables an increase in the number of parts to be prevented, so that the ability to carry out maintenance can be easily maintained. An upper electrode assembly has an upper electrode plate, a cooling plate (C/P) and a spacer interposed between the upper electrode plate and the C/P. The upper electrode plate has therein electrode plate gas-passing holes that penetrate through the upper electrode plate. The C/P has therein C/P gas-passing holes that penetrate through the C/P. The spacer has therein spacer gas-passing holes that penetrate through the spacer. The electrode plate gas-passing holes, the C/P gas-passing holes and the spacer gas-passing holes are not disposed collinearly.

18 Claims, 9 Drawing Sheets

Related U.S. Application Data

(60) Provisional application No. 60/697,996, filed on Jul. 12, 2005.

(52) U.S. Cl.
CPC .... *H01J 37/32532* (2013.01); *H01L 21/6831* (2013.01); *Y10T 279/23* (2015.01)

(58) Field of Classification Search
USPC ............... 156/345.44; 361/234; 279/128
See application file for complete search history.

(56) References Cited

U.S. PATENT DOCUMENTS

| | | | |
|---|---|---|---|
| 5,569,356 A | 10/1996 | Lenz et al. | |
| 5,618,350 A * | 4/1997 | Ishikawa | C23C 16/46 118/500 |
| 5,625,526 A * | 4/1997 | Watanabe et al. | 361/234 |
| 5,691,876 A * | 11/1997 | Chen et al. | 361/234 |
| 5,766,364 A | 6/1998 | Ishida et al. | |
| 5,822,171 A * | 10/1998 | Shamouilian et al. | 361/234 |
| 5,908,334 A * | 6/1999 | Chen et al. | 439/824 |
| 5,919,332 A | 7/1999 | Koshiishi et al. | |
| 6,079,355 A | 6/2000 | Lou et al. | |
| 6,110,556 A | 8/2000 | Bang et al. | |
| 6,151,203 A * | 11/2000 | Shamouilian et al. | 361/234 |
| 7,126,093 B2 * | 10/2006 | Goto et al. | 219/444.1 |
| 7,821,767 B2 * | 10/2010 | Fujii | 361/234 |
| 2002/0144783 A1 | 10/2002 | Tran et al. | |
| 2002/0153349 A1 | 10/2002 | Okumura et al. | |
| 2003/0155078 A1 | 8/2003 | Ogasawara et al. | |
| 2004/0050326 A1 | 3/2004 | Thilderkvist et al. | |
| 2004/0099708 A1 * | 5/2004 | Hiramatsu et al. | 228/8 |
| 2004/0196614 A1 * | 10/2004 | Miyaji et al. | 361/234 |
| 2005/0000442 A1 | 1/2005 | Hayashi et al. | |
| 2005/0005994 A1 | 1/2005 | Sugiyama et al. | |
| 2006/0081337 A1 | 4/2006 | Himori et al. | |
| 2006/0144516 A1 * | 7/2006 | Ricci et al. | 156/345.27 |

FOREIGN PATENT DOCUMENTS

| | | |
|---|---|---|
| JP | 2002-246371 | 8/2002 |
| JP | 2003257937 A | 9/2003 |
| JP | 2004-193567 | 7/2004 |
| JP | 2004-356531 | 12/2004 |

OTHER PUBLICATIONS

Office Action mailed Jul. 24, 2009, in co-pending U.S. Appl. No. 11/453,140.
Office Action mailed Jan. 26, 2010, in co-pending U.S. Appl. No. 11/453,140.
Office Action mailed Dec. 16, 2010, in co-pending U.S. Appl. No. 11/453,140.
Office Action mailed Jun. 9, 2011, in co-pending U.S. Appl. No. 11/453,140.
Office Action mailed Nov. 1, 2011, in co-pending U.S. Appl. No. 11/453,140.

* cited by examiner

ELECTRODE ASSEMBLY AND PLASMA PROCESSING APPARATUS

CROSS-REFERENCE TO RELATED APPLICATIONS

This is a continuation in part application of, and claims the benefit of priority under 35 U.S.C. §120 from, U.S. application Ser. No. 11/453,140, filed Jun. 15, 2006, herein incorporated by reference, which is a utility application of U.S. application Ser. No. 60/697,996, and which claims the benefit of priority under 35 U.S.C. §119 from Japanese Patent Application No. 2005-182479 filed Jun. 22, 2005.

BACKGROUND OF THE INVENTION

Field of the Invention

The present invention relates to an electrode assembly and a plasma processing apparatus, and in particular relates to an electrode assembly having an electrode plate having gas-passing holes therein.

Description of the Related Art

Plasma processing apparatuses that carry out desired plasma processing on semiconductor device wafers as substrates have been known from hitherto. Such a plasma processing apparatus has a processing chamber in which a wafer is housed. A stage (hereinafter referred to as a "susceptor") on which the wafer is mounted and that acts as a lower electrode, and an upper electrode that faces the susceptor are disposed in the processing chamber. Moreover, a radio frequency power source is connected to at least one of the stage and the upper electrode, so that radio frequency electrical power can be applied into a processing chamber inner space between the stage and the upper electrode.

In such a plasma processing apparatus, a processing gas supplied into the processing chamber inner space is turned into plasma by the radio frequency electrical power so as to produce ions and radicals, and the ions and radicals are led onto the wafer, whereby the wafer is subjected to the desired plasma processing, for example etching.

The upper electrode has an upper electrode plate that faces onto the processing chamber inner space, an electrode support having therein a buffer chamber into which a processing gas supplied in from the outside is introduced and which is open at a lower portion thereof, and a cooling plate that is interposed between the upper electrode plate and the electrode support and closes up the lower portion of the buffer chamber. Here, the upper electrode plate, the cooling plate, and the electrode support together constitute an electrode assembly. The upper electrode plate and the cooling plate each have therein a plurality of gas-passing holes penetrating therethrough. In the upper electrode, the gas-passing holes in the upper electrode plate communicate with the gas-passing holes in the cooling plate, and the communicated gas-passing holes lead the processing gas from the buffer chamber into the processing chamber inner space.

With a conventional plasma processing apparatus, upon the desired plasma processing being carried out repeatedly on wafers, the upper electrode plate is worn down by the ions and so on, and hence the gas-passing holes in the upper electrode plate become enlarged. Moreover, the gas-passing holes in the upper electrode plate and the gas-passing holes in the cooling plate are disposed collinearly with one another. As a result, when the desired plasma processing is carried out on a wafer, ions produced in the processing chamber inner space may flow back through the gas-passing holes in the upper electrode plate, and thus infiltrate into the gas-passing holes in the cooling plate. The upper electrode plate is made of semiconductor silicon (Si), but the cooling plate is made of aluminum (Al), which is a conductor, and hence there has been a problem of abnormal electrical discharges occurring due to ions that have infiltrated into the gas-passing holes in the cooling plate, whereby the upper electrode plate is damaged.

In recent years, cylindrical embedded members that are inserted into the gas-passing holes in the upper electrode plate have thus been developed. Each of the embedded members has a spiral groove formed in an outer peripheral surface thereof; ions that flow back through a gas-passing hole in the upper electrode plate and infiltrate into the groove collide with a wall of the groove so that the ions lose energy, whereby the ions are prevented from infiltrating into the gas-passing holes in the cooling plate and hence the upper electrode plate is prevented from being damaged (see, for example, Japanese Laid-open Patent Publication (Kokai) No. 2004-356531).

However, in the case of using the above embedded members in a plasma processing apparatus, because there are many gas-passing holes in the upper electrode plate, many embedded members are required, and hence there is a problem that this leads to an increase in the number of parts.

Moreover, the embedded members are worn away through collisions with ions, and hence must be replaced at predetermined replacement intervals. Because many embedded members are required in the plasma processing apparatus as described above, the replacement work is troublesome, and hence there is a problem that the ability to carry out maintenance worsens.

SUMMARY OF THE INVENTION

It is an object of the present invention to provide an electrode assembly and a plasma processing apparatus that enable damage to an electrode plate to be prevented, and enable an increase in the number of parts to be prevented so that a worsening of the ability to carry out maintenance can be prevented.

To attain the above object, in a first aspect of the present invention, there is provided an electrode assembly of a plasma processing apparatus, the electrode assembly comprising an electrode plate and an intermediate member, the electrode plate having therein first gas-passing holes that penetrate through the electrode plate and the intermediate member having therein second gas-passing holes that penetrate through the intermediate member, the electrode assembly further comprising a spacer interposed between the electrode plate and the intermediate member, wherein the spacer passes a processing gas from the second gas-passing holes into the first gas-passing holes, and prevents plasma that has infiltrated into the first gas-passing holes from infiltrating into the second gas-passing holes.

According to the construction of the first aspect as described above, in the electrode assembly of the plasma processing apparatus, the spacer interposed between the electrode plate and the intermediate member allows passage of the processing gas from the second gas-passing holes in the intermediate member into the first gas-passing holes in the electrode plate, but prevents plasma that has infiltrated into the first gas-passing holes from infiltrating into the second gas-passing holes. As a result, the electrode plate can be prevented from being damaged due to abnormal electrical discharges caused by plasma infiltrating into the second gas-passing holes, and moreover an increase in the number of parts can be prevented so that a worsening of the ability to carry out maintenance can be prevented.

Preferably, the spacer has therein gas channels that comprise at least third gas-passing holes penetrating through the spacer, and communicate the second gas-passing holes and the first gas-passing holes together, and the first gas-passing holes, the second gas-passing holes, and the third gas-passing holes are not disposed collinearly.

According to the construction of the first aspect as described above, the first gas-passing holes, the second gas-passing holes, and the third gas-passing holes penetrating through the spacer in the gas channels in the spacer that communicate the second gas-passing holes and the first gas-passing holes together are not disposed collinearly. As a result, plasma that has infiltrated into the first gas-passing holes can be made to lose energy through collisions, whereby the plasma that has infiltrated into the first gas-passing holes can be reliably prevented from infiltrating into the second gas-passing holes.

More preferably, the spacer is a plate-shaped member, and the gas channels include grooves formed in at least one of a surface of the spacer facing the intermediate member and a surface of the spacer facing the electrode plate.

According to the construction of the first aspect as described above, the gas channels in the spacer, which is the plate-shaped member, include grooves formed in at least one of the surface of the spacer facing the intermediate member and the surface of the spacer facing the electrode plate. As a result, plasma that has infiltrated into the first gas-passing holes is led into the grooves, where the plasma can be made to lose energy reliably through collisions with the surface of the spacer and the surface of the intermediate member, whereby the plasma that has infiltrated into the first gas-passing holes can be reliably prevented from infiltrating into the second gas-passing holes.

More preferably, the first gas-passing holes, the second gas-passing holes, and the gas channels together comprise processing gas supply paths, and the processing gas supply paths have a conductance in a range of $6.9 \times 10^5$ to $2.1 \times 10^6$.

According to the construction of the first aspect as described above, the processing gas supply paths comprising the first gas-passing holes, the second gas-passing holes, and the gas channels have a conductance in a range of $6.9 \times 10^5$ to $2.1 \times 10^6$. As a result, the efficiency of supply of the processing gas can be maintained at substantially the same level as in a conventional plasma processing apparatus, and hence the efficiency of the substrate processing can be prevented from decreasing.

Preferably, the spacer is made of a porous material.

According to the construction of the first aspect as described above, the spacer is made of a porous material. As a result, plasma that has infiltrated into the first gas-passing holes can be made to lose energy through collisions with walls of pores in the porous material, whereby the plasma that has infiltrated into the first gas-passing holes can be reliably prevented from infiltrating into the second gas-passing holes.

Preferably, there is electrical continuity between the electrode plate and the intermediate member.

According to the construction of the first aspect as described above, there is electrical continuity between the electrode plate and the intermediate member. As a result, the electrode plate can be prevented from becoming charged, and hence an electric field can be prevented from being produced in the first gas-passing holes. Plasma that has infiltrated into the first gas-passing holes can thus be prevented from being activated by such an electric field, and hence can be prevented from infiltrating into the second gas-passing holes.

More preferably, the electrode assembly further has at least one bolt made of a conductive material that fastens the intermediate member to the electrode plate, the electrode plate is made of a semiconductor, the intermediate member is made of a conductor and has an insulating film covering a surface thereof, and the conductor is exposed through the insulating film in at least part of a region where the intermediate member contacts the bolt.

According to the construction of the first aspect as described above, in at least part of the region where the intermediate member made of a conductor contacts the bolt made of a conductive material that fastens the intermediate member to the electrode plate made of a semiconductor, the conductor is exposed through the insulating film covering the surface of the intermediate member. As a result, electrical continuity between the electrode plate and the intermediate member can be obtained reliably.

Preferably, the upper electrode assembly further has cylindrical tubular positioning pins for carrying out positioning of the intermediate member and the spacer, and each of the positioning pins has a C-shaped cross section.

According to the construction of the first aspect as described above, each of the cylindrical tubular positioning pins for carrying out positioning of the intermediate member and the spacer has a C-shaped cross section. As a result, thermal expansion of the positioning pins can be absorbed, and hence the spacer can be prevented from being damaged.

Preferably, the spacer is made of one of silicon and silicon carbide.

According to the construction of the first aspect as described above, the spacer is made of silicon or silicon carbide. As a result, abnormal electrical discharges caused by infiltrating plasma can be prevented from occurring in the first gas-passing holes, and hence the electrode plate can be reliably prevented from being damaged.

To attain the above object, in a second aspect of the present invention, there is provided a plasma processing apparatus comprising a processing chamber in which a substrate is housed, a substrate stage disposed in the processing chamber, an upper electrode facing the substrate stage in the processing chamber, and a processing gas supply unit that supplies a processing gas into the processing chamber via the upper electrode, the upper electrode comprising an electrode assembly comprising an electrode plate and an intermediate member, the electrode plate having therein first gas-passing holes that penetrate through the electrode plate and the intermediate member having therein second gas-passing holes that penetrate through the intermediate member, wherein the electrode assembly further has a spacer interposed between the electrode plate and the intermediate member, and the spacer passes the processing gas from the second gas-passing holes into the first gas-passing holes, and prevents plasma that has infiltrated into the first gas-passing holes from infiltrating into the second gas-passing holes.

According to the construction of the second aspect as described above, in the electrode assembly of the plasma processing apparatus, the spacer interposed between the electrode plate and the intermediate member allows passage of the processing gas from the second gas-passing holes in the intermediate member into the first gas-passing holes in the electrode plate, but prevents plasma that has infiltrated into the first gas-passing holes from infiltrating into the second gas-passing holes. As a result, the electrode plate can be prevented from being damaged due to abnormal electrical discharges caused by plasma infiltrating into the second gas-passing holes, and moreover an increase in the number of parts can be prevented so that a worsening of the ability to carry out maintenance can be prevented.

Preferably, the spacer has therein gas channels that comprise at least third gas-passing holes penetrating through the spacer, and communicate the second gas-passing holes and the first gas-passing holes together, and in the electrode assembly, the first gas-passing holes, the second gas-passing holes, and the third gas-passing holes are not disposed collinearly.

More preferably, in the electrode assembly, the first gas-passing holes, the second gas-passing holes, and the gas channels together comprise processing gas supply paths, and the processing gas supply paths have a conductance in a range of $6.9 \times 10^5$ to $2.1 \times 10^6$.

Preferably, the spacer is made of a porous material.

Preferably, in the electrode assembly, there is electrical continuity between the electrode plate and the intermediate member.

Preferably, the electrode assembly further has cylindrical tubular positioning pins for carrying out positioning of the intermediate member and the spacer, and each of the positioning pins has a C-shaped cross section.

Preferably, the electrode plate comprises an annular first electrode plate, and a second electrode plate disposed insulated from the first electrode plate on an inside of the first electrode plate, and the processing gas supply unit has a flow rate controller that adjusts a ratio between a flow rate of the processing gas supplied into the processing chamber via the first electrode plate and a flow rate of the processing gas supplied into the processing chamber via the second electrode plate.

According to the construction of the second aspect as described above, the ratio between the flow rate of the processing gas supplied into the processing chamber via the first electrode plate and the flow rate of the processing gas supplied into the processing chamber via the second electrode plate is adjusted. As a result, the spatial distribution of radicals in the processing chamber can be controlled as desired.

The above and other objects, features, and advantages of the invention will become more apparent from the following detailed description taken in conjunction with the accompanying drawings.

BRIEF DESCRIPTION OF THE DRAWINGS

FIG. 4A is a view showing a first variation;
FIG. 4B is a view showing a second variation;
FIG. 4C is a view showing a third variation;
FIG. 4D is a view showing a fourth variation; and
FIG. 4E is a view showing a fifth variation;

DETAILED DESCRIPTION OF THE PREFERRED EMBODIMENTS

The present invention will now be described in detail with reference to the drawings showing preferred embodiments thereof.

First, a plasma processing apparatus according to a first embodiment of the present invention will be described.

Figure 1:
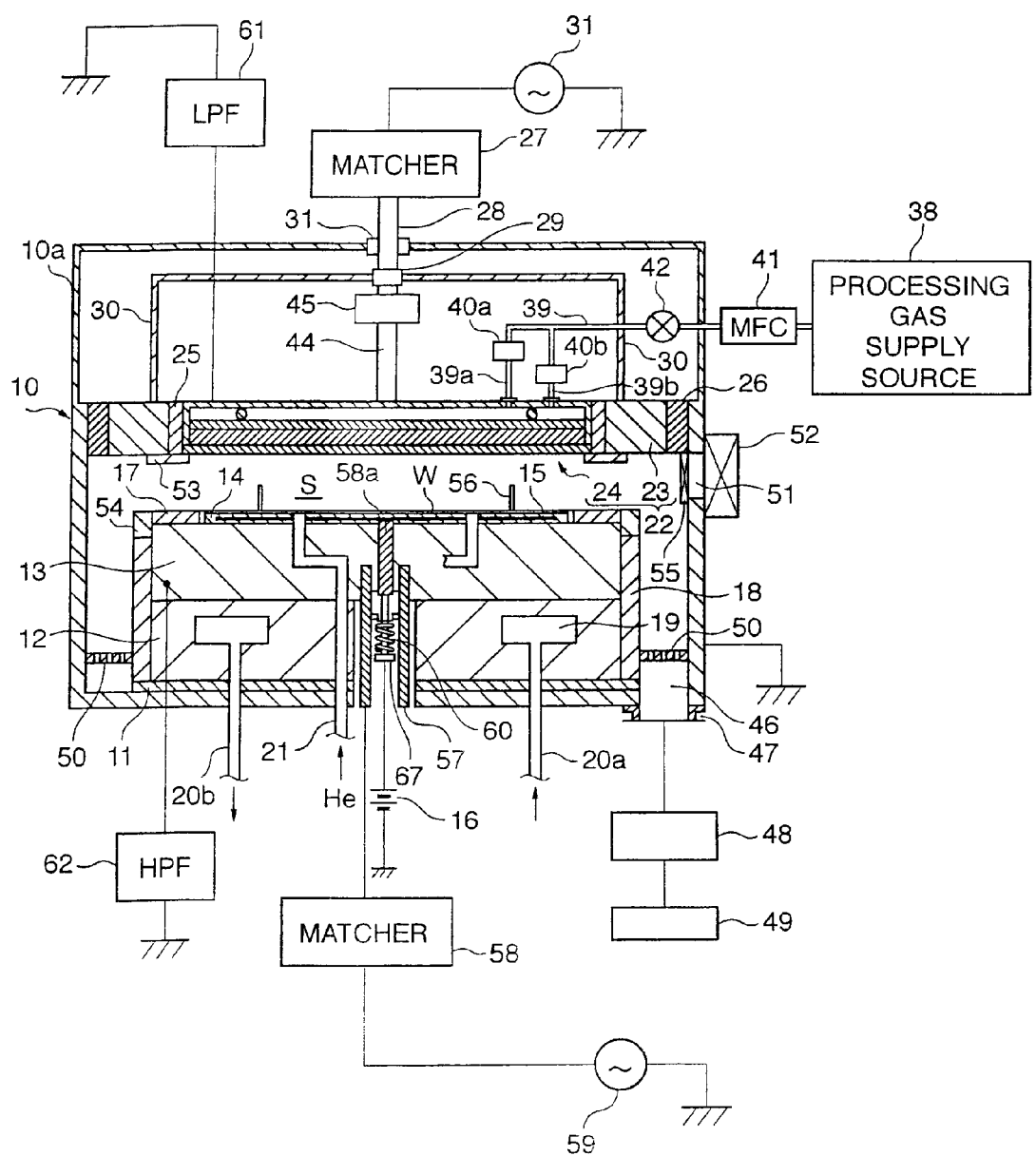
FIG. 1 is a sectional view schematically showing the construction of a plasma processing apparatus according to a first embodiment of the present invention.

FIG. 1 is a sectional view schematically showing the construction of the plasma processing apparatus according to the present embodiment.

As shown in FIG. 1, the plasma processing apparatus 1 is constructed as a capacitively coupled parallel plate plasma etching apparatus, and has a cylindrical tubular chamber 10 (processing chamber) that is made of aluminum having a surface thereof treated with alumite (anodized). The chamber 10 is grounded for safety.

A cylindrical susceptor supporting stage 12 is disposed on a bottom portion of the chamber 10 via an insulating plate 11 made of a ceramic or the like, and a susceptor 13 made, for example, of aluminum is disposed on the susceptor supporting stage 12. The susceptor 13 constitutes a lower electrode, and has mounted thereon a substrate to be etched such as a semiconductor wafer W.

An electrostatic chuck (ESC) 14 for holding the semiconductor wafer W by electrostatic attraction is disposed on an upper surface of the susceptor 13. The electrostatic chuck 14 is comprised of a lower electrode plate 15 made of an electrically conductive film, and a pair of insulating layers or insulating sheets that sandwich the lower electrode plate 15 therebetween. A DC power source 16 is electrically connected to the lower electrode plate 15 via a connecting terminal 58a and a movable feeder rod 67, described below. The electrostatic chuck 14 attracts and holds a semiconductor wafer W thereon through a Johnsen-Rahbek force or a Coulomb force due to a DC voltage applied by the DC power source 16.

A plurality of pusher pins 56 are provided in a portion of the upper surface of the electrostatic chuck 14 on which the semiconductor wafer W is attracted and held as lifting pins that can be made to project out from the upper surface of the electrostatic chuck 14. The pusher pins 56 are connected to a motor (not shown) by a ball screw (not shown), and can thus be made to project out from the upper surface of the electrostatic chuck 14 through rotational motion of the motor, which is converted into linear motion by the ball screw. The pusher pins 56 are housed inside the electrostatic chuck 14 when the electrostatic chuck 14 is attracting and holding a semiconductor wafer W while the semiconductor wafer W is being subjected to the etching, and are made to project out from the upper surface of the electrostatic chuck 14 so as to lift the semiconductor wafer W up away from the electrostatic chuck 14 when the semiconductor wafer W is to be transferred out from a space S in which the plasma is produced (hereinafter referred to as the "plasma production space S"), after having been subjected to the etching.

A focus ring 17 made, for example, of silicon (Si) for improving the uniformity of the etching is disposed on the upper surface of the susceptor 13 surrounding the electrostatic chuck 14, and a cover ring 54 that protects a side portion of the focus ring 17 is disposed surrounding the focus ring 17. A cylindrical tubular inner wall member 18 made, for example, of quartz ($SiO_2$) is bonded to a side surface of each of the susceptor 13 and the susceptor supporting stage 12.

A coolant chamber 19 that extends, for example, in a circumferential direction of the susceptor supporting stage 12 is provided inside the susceptor supporting stage 12. A coolant, for example cooling water, at a predetermined temperature is circulated through the coolant chamber 19 via piping 20a and 20b from an external chiller unit (not shown). The coolant chamber 19 controls a processing temperature of the semiconductor wafer W on the susceptor 13 through the temperature of the coolant.

Moreover, a heat-transmitting gas such as helium (He) gas from a heat-transmitting gas supply mechanism (not shown) is supplied in between the upper surface of the electrostatic chuck 14 and a rear surface of the semiconductor wafer W via a gas supply line 21.

An upper electrode 22 that is parallel to the susceptor 13 and faces the susceptor 13 is disposed above the susceptor 13. Here, a space between the susceptor 13 and the upper electrode 22 acts as the plasma production space S (processing chamber inner space). The upper electrode 22 is comprised of an annular or donut-shaped outer upper electrode 23 disposed facing the susceptor 13 with a predetermined gap therebetween, and a disk-shaped inner upper electrode 24 disposed insulated from the outer upper electrode 23 on the inside of the outer upper electrode 23 in a radial direction. The outer upper electrode 23 has a major role in production of the plasma, and the inner upper electrode 24 is auxiliary.

Figure 2:
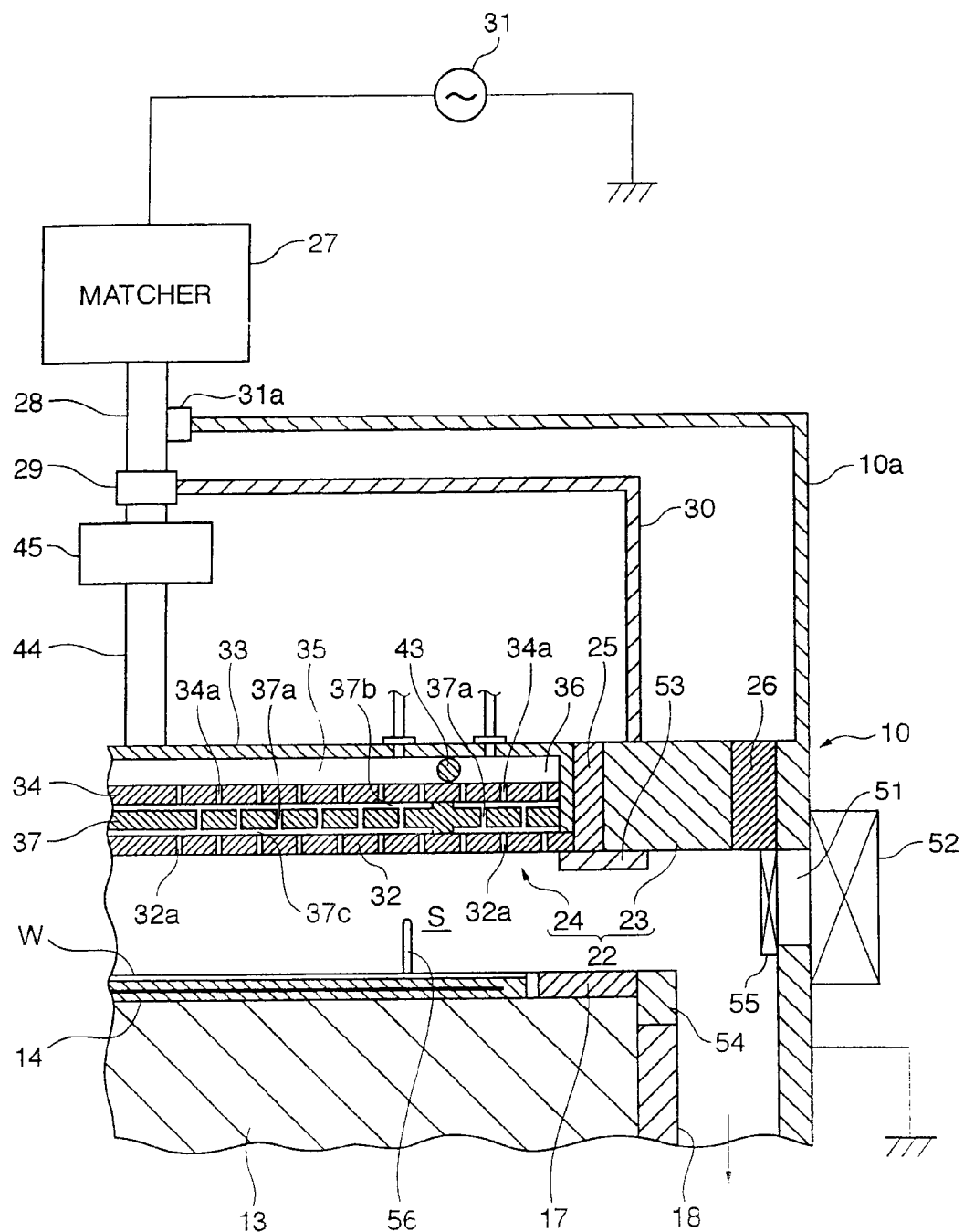
FIG. 2 is an enlarged sectional view schematically showing the construction of an upper electrode appearing in FIG. 1 and vicinity thereof.

FIG. 2 is an enlarged sectional view schematically showing the construction of the upper electrode 22 appearing in FIG. 1 and vicinity thereof.

As shown in FIG. 2, an annular gap of, for example, 0.25 to 2.0 mm is formed between the outer upper electrode 23 and the inner upper electrode 24, and a dielectric body 25 made, for example, of quartz is disposed in the gap. Alternatively, a ceramic body may be disposed in the gap instead of the quartz dielectric body 25. A capacitor is formed through the outer upper electrode 23 and the inner upper electrode 24 having the dielectric body 25 sandwiched therebetween. The capacitance C1 of the capacitor can be selected or adjusted to a desired value through the size of the gap and the dielectric constant of the dielectric body 25. Moreover, an annular insulating shielding member 26 made, for example, of alumina ($Al_2O_3$) or yttria ($Y_2O_3$) is disposed so as to hermetically seal between the outer upper electrode 23 and a side wall of the chamber 10.

The outer upper electrode 23 is preferably made of a low-resistance conductor or semiconductor of low Joule heat, for example silicon. An upper radio frequency power source 31 is electrically connected to the outer upper electrode 23 via an upper matcher 27, an upper feeder rod 28, a connector 29 and a feeder tube 30. The upper radio frequency power source 31 outputs a radio frequency voltage of frequency not less than 13.5 MHz, for example 60 MHz. The function of the upper matcher 27 is to match the load impedance to the internal (or output) impedance of the upper radio frequency power source 31, so that when the plasma is produced in the chamber 10, the load impedance is apparently equal to the output impedance of the upper radio frequency power source 31. An output terminal of the upper matcher 27 is connected to an upper end of the upper feeder rod 28.

The feeder tube 30 is comprised of a substantially cylindrical tubular or conical electrically conductive plate, for example aluminum plate or copper plate. A lower end of the feeder tube 30 is connected to the outer upper electrode 23 continuously in a circumferential direction, and an upper end of the feeder tube 30 is electrically connected to a lower end of the upper feeder rod 28 via the connector 29. On the outside of the feeder tube 30, the side wall of the chamber 10 extends upward beyond the height of the upper electrode 22 so as to form a cylindrical tubular ground conductor 10a. An upper end of the cylindrical tubular ground conductor 10a is electrically insulated from the upper feeder rod 28 by a tubular insulating member 31a. According to this construction, regarding the load circuit from the point of view of the connector 29, a coaxial line having the feeder tube 30 and the outer upper electrode 23 as a waveguide is formed by the feeder tube 30, the outer upper electrode 23 and the cylindrical tubular ground conductor 10a.

The inner upper electrode 24 has an upper electrode plate 32 that is made, for example, of a semiconductor material such as silicon or silicon carbide (SiC) and has many electrode plate gas-passing holes 32a (first gas-passing holes) therein, and an electrode support 33 that is made of an electrically conductive material such as aluminum surface-treated with alumite and detachably supports the upper electrode plate 32. The upper electrode plate 32 is fastened to the electrode support 33 by bolts (not shown). Heads of the bolts are protected by an annular shield ring 53 disposed on a lower portion of the upper electrode plate 32.

Each of the electrode plate gas-passing holes 32a in the upper electrode plate 32 penetrates through the upper electrode plate 32. A buffer chamber into which a processing gas, described below, is introduced is formed inside the electrode support 33. The buffer chamber is partitioned into two buffer chambers, i.e. a central buffer chamber 35 and a peripheral buffer chamber 36, that are partitioned from one another by an annular partitioning member 43 comprised, for example, of an O-ring, and these buffer chambers are each open at a lower portion thereof. A cooling plate (hereinafter referred to as the "C/P") 34 (intermediate member) that closes up the lower portion of each of the buffer chambers is disposed below the electrode support 33. The C/P 34 is made of aluminum surface-treated with alumite, and has many C/P gas-passing holes 34a (second gas-passing holes) therein. Each of the C/P gas-passing holes 34a in the C/P 34 penetrates through the C/P 34.

A spacer 37 made of a semiconductor material such as silicon or silicon carbide is interposed between the upper electrode plate 32 and the C/P 34.

Figure 3:
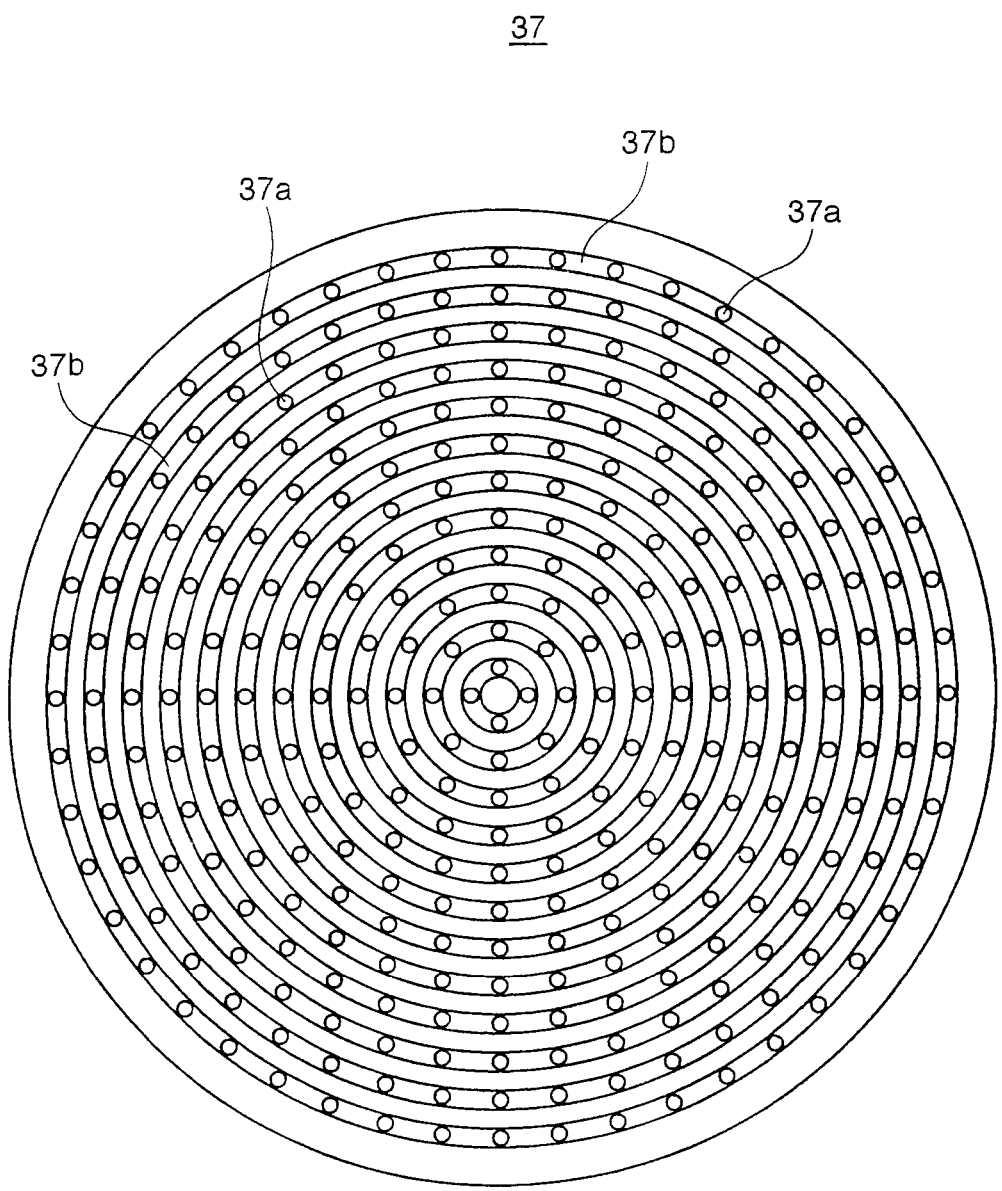
FIG. 3 is a plan view of a spacer appearing in FIG. 2 as viewed from a cooling plate side.

FIG. 3 is a plan view of the spacer 37 appearing in FIG. 2 as viewed from the cooling plate (C/P 34) side.

As shown in FIG. 3, the spacer 37 is a disk-shaped member, and has therein many upper surface annular grooves 37b that are concentrically with the disk constituting the spacer 37 in a surface of the spacer 37 facing the C/P 34 (hereinafter referred to as merely the "upper surface"), and many spacer gas-passing holes 37a (third gas-passing holes) that penetrate through the spacer 37 and each open out at a bottom portion of one of the upper surface annular grooves 37b. The upper surface annular grooves 37b are arranged such as to face the C/P gas-passing holes 34a when the spacer 37 and the C/P 34 have been assembled together.

The spacer 37 also has in a surface thereof facing the upper electrode plate 32 (hereinafter referred to merely as the "lower surface") many lower surface annular grooves 37c formed concentrically with the disk constituting the spacer 37. The lower surface annular grooves 37c are arranged such as to face the electrode plate gas-passing holes 32a when the spacer 37 and the upper electrode plate 32 have been assembled together. The spacer gas-passing holes 37a each open out at a bottom portion of one of the lower surface annular grooves 37c. The spacer gas-passing holes 37a, the upper surface annular grooves 37b, and the lower surface annular grooves 37c together constitute spacer gas channels, the spacer gas channels communicating the C/P gas-passing holes 34a and the electrode plate gas-passing holes 32a together.

Here, the thickness of the spacer 37 is set such that the thickness of the laminate comprised of the spacer 37 and the C/P 34 is the same as the thickness of the cooling plate in a conventional plasma processing apparatus. As a result, the thickness of the upper electrode plate 32 can be made to be the same as the thickness of the upper electrode plate in the conventional plasma processing apparatus, and hence the upper electrode plate from the conventional plasma processing apparatus can be used as the upper electrode plate 32. In the present embodiment, the upper electrode plate 32, the spacer 37, the C/P 34, and the electrode support 33 described above together constitute an upper electrode assembly, which can be replaced all as one when carrying out maintenance or the like on the plasma processing apparatus 1.

Returning to FIG. 2, the inner upper electrode 24 supplies the processing gas, which is introduced into the buffer chambers from a processing gas supply source 38, described below, into the plasma production space S via the C/P gas-passing holes 34a in the C/P 34, the spacer gas channels in the spacer 37, and the electrode plate gas-passing holes 32a in the upper electrode plate 32. Here, the central buffer chamber 35, and the plurality of C/P gas-passing holes 34a, spacer gas channels and electrode plate gas-passing holes 32a therebelow together constitute a central shower head (processing gas supply paths), while the peripheral buffer chamber 36, and the plurality of C/P gas-passing holes 34a, spacer gas channels and electrode plate gas-passing holes 32a therebelow together constitute a peripheral shower head (processing gas supply paths).

Moreover, in each of the central shower head and the peripheral shower head, the spacer gas-passing holes 37a, the electrode plate gas-passing holes 32a, and the C/P gas-passing holes 34a are not disposed collinearly with one another, and thus form a labyrinth. That is, each of the gas-passing holes in one of the above three sets of gas-passing holes does not have disposed on a central axis thereof any of the gas-passing holes from one of the other two sets. Here, the arrangement of the spacer gas-passing holes 37a, the electrode plate gas-passing holes 32a, and the C/P gas-passing holes 34a is not limited to the arrangement shown in FIG. 2, but rather arrangements such as those shown in FIGS. 4A to 4E may also be adopted.

Figure 4A:
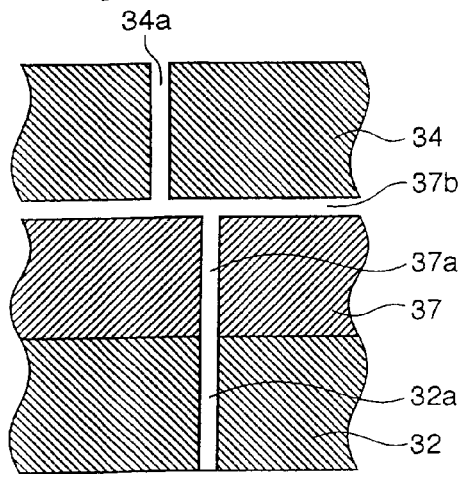
FIGS. 4A to 4E are views showing variations of the arrangement of spacer gas-passing holes, electrode plate gas-passing holes, and C/P gas-passing holes appearing in FIG. 2; specifically.

For example, in FIG. 4A, the spacer gas-passing holes 37a and the electrode plate gas-passing holes 32a are disposed collinearly with one another, but the C/P gas-passing holes 34a are not disposed on the central axes of the spacer gas-passing holes 37a and the electrode plate gas-passing holes 32a. Moreover, the spacer 37 has only the upper surface annular grooves 37b therein (i.e. the lower surface annular grooves 37c are omitted), the upper surface annular grooves 37b communicating the C/P gas-passing holes 34a and the spacer gas-passing holes 37a together.

Figure 4B:
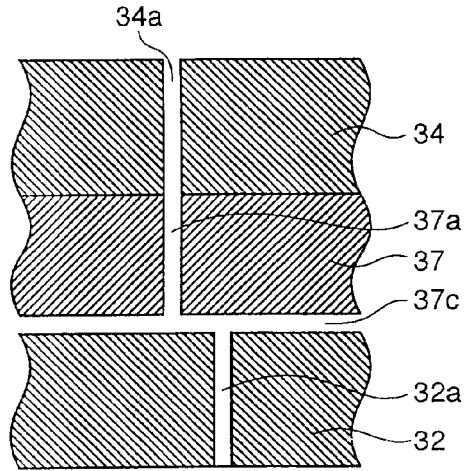

In FIG. 4B, the spacer gas-passing holes 37a and the C/P gas-passing holes 34a are disposed collinearly with one another, but the electrode plate gas-passing holes 32a are not disposed on the central axes of the spacer gas-passing holes 37a and the C/P gas-passing holes 34a. Moreover, the spacer 37 has only the lower surface annular grooves 37c therein (i.e. the upper surface annular grooves 37b are omitted), the lower surface annular grooves 37c communicating the electrode plate gas-passing holes 32a and the spacer gas-passing holes 37a together.

Figure 4C:
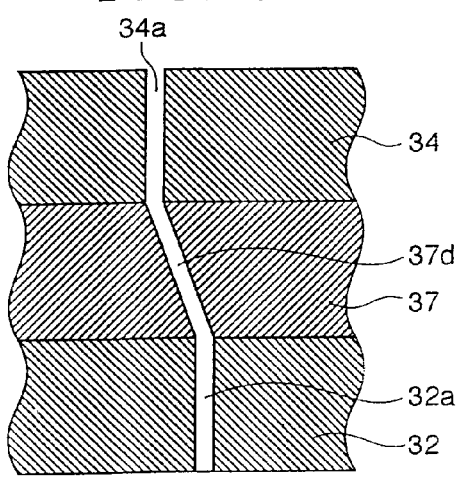

In FIG. 4C, the C/P gas-passing holes 34a and the electrode plate gas-passing holes 32a are not disposed collinearly with one another, and are communicated together by spacer gas-passing holes 37d that each penetrate through the spacer 37 on a slant. The spacer 37 has neither the upper surface annular grooves 37b nor the lower surface annular grooves 37c therein.

Figure 4D:
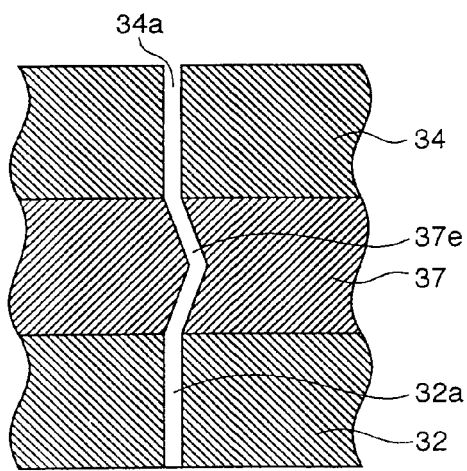

In FIG. 4D, the C/P gas-passing holes 34a and the electrode plate gas-passing holes 32a are disposed collinearly with one another, and are communicated together by spacer gas-passing holes 37e that each penetrate through the spacer 37 in a V shape.

Figure 4E:
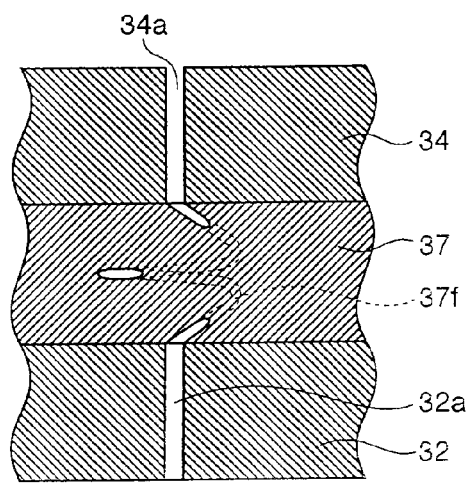

In FIG. 4E, the C/P gas-passing holes 34a and the electrode plate gas-passing holes 32a are disposed collinearly with one another, and are communicated together by spacer gas-passing holes 37f that each penetrate through the spacer 37 spirally. Moreover, other than the arrangements shown in FIGS. 4A to 4E, so long as the arrangement is such that each of the gas-passing holes in one of the above three sets of gas-passing holes does not have disposed on a central axis thereof any of the gas-passing holes from one of the other two sets, any arrangement may be adopted.

For each of the above arrangements, the conductance for the central shower head and the peripheral shower head is preferably substantially the same as the conductance for the gas-passing holes in the upper electrode plate and the gas-passing holes in the cooling plate in a conventional plasma processing apparatus, specifically is preferably in a range of the conductance in a conventional plasma processing apparatus ±50%, i.e. any value in a range of $6.9 \times 10^5$ to $2.1 \times 10^6$.

Returning to FIG. 1, the processing gas supply source 38 is disposed outside the chamber 10. The processing gas supply source 38 supplies the processing gas at a desired flow rate ratio into the central buffer chamber 35 and the peripheral buffer chamber 36. Specifically, a gas supply pipe 39 from the processing gas supply source 38 branches part way therealong into branch pipes 39a and 39b, which are connected respectively to the central buffer chamber 35 and the peripheral buffer chamber 36. The branch pipes 39a and 39b have respectively therein flow rate control valves 40a and 40b (flow rate controllers). The conductances of the flow paths from the processing gas supply source 38 to the central buffer chamber 35 and the peripheral buffer chamber 36 are set to be equal to one another, and hence the flow rate ratio for the processing gas supplied into the central buffer chamber 35 and the peripheral buffer chamber 36 can be adjusted as desired by adjusting the flow rate control valves 40a and 40b. The gas supply pipe 39 further has a mass flow controller (MFC) 41 and an opening/closing valve 42 disposed therein.

For the plasma processing apparatus 1, by adjusting the flow rate ratio for the processing gas introduced into the central buffer chamber 35 and the peripheral buffer chamber 36 using the above construction, the ratio (FC/FE) between the flow rate FC of the gas discharged from the central shower head and the flow rate FE of the gas discharged from the peripheral shower head can be adjusted as desired. Moreover, the flow rate per unit area of the processing gas discharged from each of the central shower head and the peripheral shower head can be adjusted individually. Alternatively, by providing two processing gas supply sources for the branch pipes 39a and 39b respectively, the gas type or gas mixing ratio of the processing gas discharged from each of the central shower head and the peripheral shower head can be set individually (independently).

The upper radio frequency power source 31 is electrically connected to the electrode support 33 of the inner upper electrode 24 via the upper matcher 27, the upper feeder rod 28, the connector 29, and an upper feeder tube 44. A variable capacitor 45 that enables the capacitance to be variably adjusted is disposed part way along the upper feeder tube 44. The outer upper electrode 23 and the inner upper electrode 24 may be further provided with a coolant chamber or cooling jacket (not shown), so that the temperature of these electrodes can be controlled by a coolant supplied in from the external chiller unit (not shown).

An exhaust port 46 is provided in the bottom portion of the chamber 10. An automatic pressure control valve (hereinafter referred to as the "APC valve") 48, which is a variable butterfly valve, and a turbo-molecular pump (hereinafter referred to as the "TMP") 49 are connected to the exhaust port 46 via an exhaust manifold 47. The APC valve 48 and the TMP 49 are used in collaboration with one another to reduce the pressure in the plasma production space S in the chamber 10 down to a desired degree of vacuum. Moreover, an annular baffle plate 50 having a plurality of gas-passing holes therein is disposed between the exhaust port 46 and the plasma production space S so as to surround the susceptor supporting stage 12. The baffle plate 50 prevents leakage of plasma from the plasma production space S into the exhaust port 46.

A transfer port 51 for the semiconductor wafers W is provided in the side wall of the chamber 10. A gate valve 52 that joins the transfer port 51 to a substrate transferring apparatus (load lock module) (not shown) adjacent to the plasma processing apparatus 1 is provided outside the chamber 10. Moreover, a shutter 55, which is a slide valve that can be moved up and down pneumatically, is disposed between the transfer port 51 and the plasma production space S. The shutter 55 shuts off the transfer port 51 from the plasma production space S when the gate valve 52 is opened during transfer of a semiconductor wafer W into or out from the plasma production space S, thus preventing leakage of plasma into the load lock module via the transfer port 51.

Moreover, in the plasma processing apparatus 1, a lower radio frequency power source 59 is electrically connected to the susceptor 13 constituting the lower electrode via a lower feeder tube 57 and a lower matcher 58. The lower radio frequency power source 59 outputs a radio frequency voltage of frequency in a range of 2 to 27 MHz, for example 2 MHz. The function of the lower matcher 58 is to match the load impedance to the internal (or output) impedance of the lower radio frequency power source 59, so that when the plasma is produced in the plasma production space S in the chamber 10, the load impedance is apparently equal to the internal impedance of the lower radio frequency power source 59.

An end portion of the connecting terminal 58a, which penetrates through the susceptor 13 and is connected to the lower electrode plate 15, is exposed in an inner space inside the lower feeder tube 57, and the movable feeder rod 67, which moves up and down in the inner space, is also disposed in the inner space. When the DC voltage is to be applied to the lower electrode plate 15 by the DC power source 16, the movable feeder rod 67 rises so as to contact the connecting terminal 58a, and when the DC voltage is to not be applied to the lower electrode plate 15 by the DC power source 16, the movable feeder rod 67 falls so as to separate away from the connecting terminal 58a.

The movable feeder rod 67 has a flange on a bottom portion thereof, and moreover the lower feeder tube 57 has a flange projecting out into the inner space. A spring 60 made of silicon nitride (SiN), which is an insulator, for restricting the up/down movement of the movable feeder rod 67 is disposed between the flange of the movable feeder rod 67 and the flange of the lower feeder tube 57. In a conventional plasma processing apparatus, the spring is made of a conductor, and hence the spring becomes hot due to electromagnetic induction caused by the radio frequency electrical power flowing through the lower feeder tube, and thus deterioration of the spring has occurred. In response to this, in the present embodiment, the spring 60 is made of an insulator as described above, whereby electromagnetic induction due to the radio frequency electrical power does not arise, and hence the spring 60 does not become hot, and thus deterioration of the spring 60 can be prevented.

Figure 9:
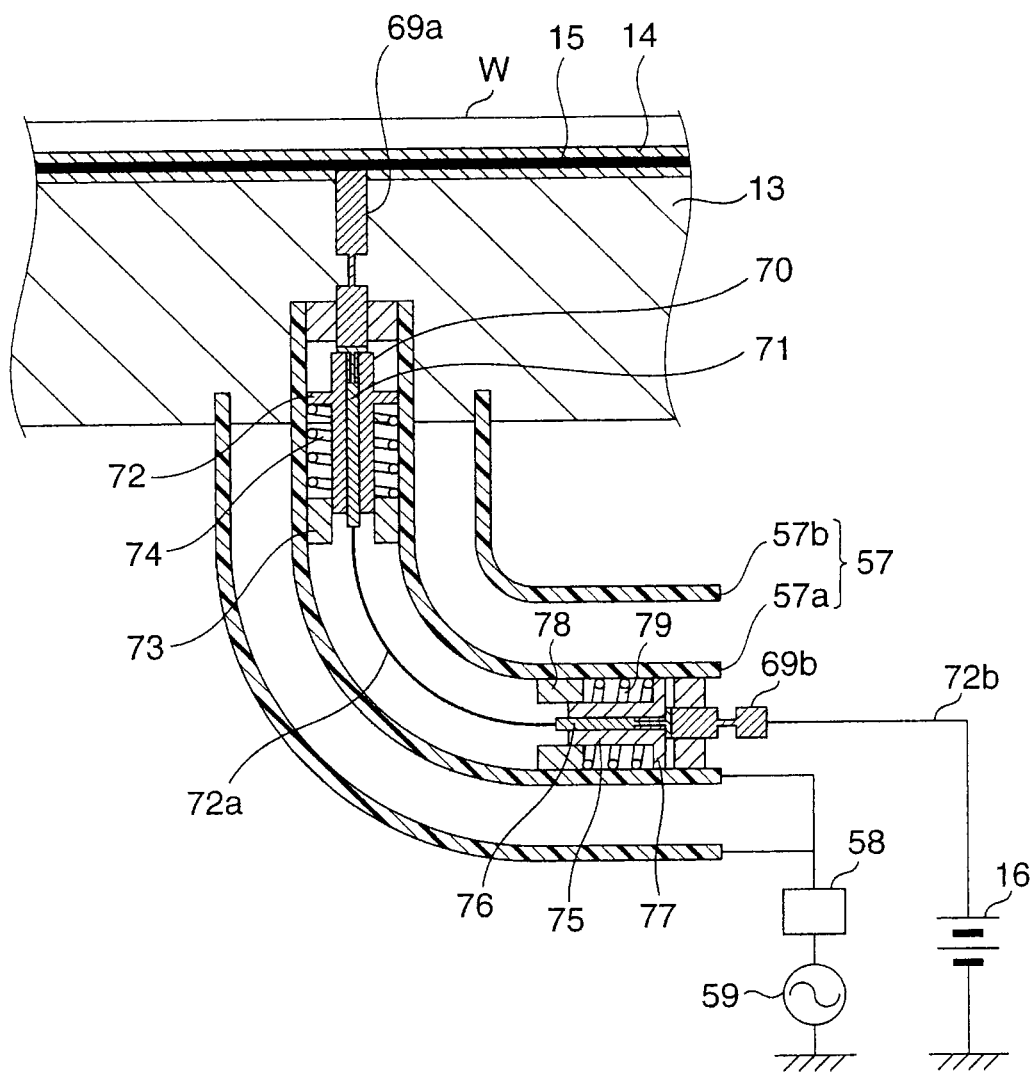
FIG. 9 is a view for explaining a variation of a spring appearing in FIG. 1.

FIG. 9 is a view for explaining a variation of a spring appearing in FIG. 1.

In FIG. 9, the lower feeder tube 57 is constructed by a conductive pipe such as a double tube made of aluminum. An inner tube 57a functions as a supply path which supplies the radio frequency electrical power from the lower radio frequency power source 59 to the susceptor 13. An outer tube 57b functions as a return path through which the radio frequency electrical power returns from the susceptor 13.

In an inner space at one end portion of the inner tube 57a in the vicinity of the susceptor 13, an end portion of a connecting terminal 69a, a part of which is comprised of a pin-shaped rod, is exposed. The connecting terminal 69a is connected to the lower electrode plate 15 and penetrates through the susceptor 13. Moreover, in the inner space at the end portion of the inner tube 57a in the vicinity of the susceptor 13, a movable connecting member 70 is disposed. The movable connecting member 70 moves up and down in the inner space.

The movable connecting member 70 is comprised of a hollow cylindrical insulating member which has therein a feeder rod 71 for applying a DC voltage. The feeder rod 71 is made of conductive material. The feeder rod 71 is fitted into the movable connecting member 70 so that the feeder rod 71 moves together with the movable connecting member 70 integrally.

Both ends of the feeder rod 71 are exposed at both ends of the movable connecting member 70 respectively.

One end of the feeder rod 71 is in contact with an end portion of the connecting terminal 69a, and the other end is connected to a wiring 72a.

An outer diameter of the movable connecting member 70 is set smaller than an inner diameter of the inner tube 57a. A disc-shaped flange 72 protrudes from an outer surface of the movable connecting member 70. The inner tube 57a has a stage 73 rigidly disposed in the inner space at the end portion of the inner tube 57a in the vicinity of the susceptor 13. A spring 74 is disposed between the flange 72 and the stage 73. The spring 74 pushes the movable connecting member 70 to the connecting terminal 69a via the flange 72, thereby ensuring contact of the end portion of the connecting terminal 69*a* and the feeder rod 71 so that the DC voltage can be stably applied to the lower electrode plate 15.

In an inner space at another end portion of the inner tube 57*a* in the vicinity of the DC power source 16, an end portion of a connecting terminal 69*b* is exposed. The connecting terminal 69*b* is connected to the DC power source 16 via a wiring 72*b*. Moreover, in the inner space at the end portion of the inner tube 57*a* in the vicinity of the DC power source 16, a movable connecting member 75 is disposed. The movable connecting member 75 moves forward and backward in the inner space.

The movable connecting member 75 is also comprised of a hollow cylindrical insulating member which has therein a feeder rod 76 made of conductive material. The feeder rod 76 is fitted into the movable connecting member 75 so that the feeder rod 76 moves together with the movable connecting member 75 integrally.

Both ends of the feeder rod 76 are exposed at both ends of the movable connecting member 75 respectively. One end of the feeder rod 76 is in contact with an end portion of the connecting terminal 69*b*, and the other end is connected to the wiring 72*a*.

An outer diameter of the movable connecting member 75 is also set smaller than the inner diameter of the inner tube 57*a*. A disc-shaped flange 77 protrudes from an outer surface of the movable connecting member 75.

The inner tube 57*a* has a stage 78 rigidly disposed in the inner space at the end portion of the inner tube 57*a* in the vicinity of the DC power source 16. A spring 79 is disposed between the flange 77 and the stage 78. The spring 79 pushes the movable connecting member 75 to the connecting terminal 69*b* via the flange 77, thereby ensuring contact of the end portion of the connecting terminal 69*b* and the feeder rod 76 so that the DC voltage can be stably applied to the lower electrode plate 15.

In the present variation, the springs 74 and 79 are made of insulating material such as a resin including a polyether ether ketone resin. Accordingly, electromagnetic induction due to the radio frequency electrical power does not arise in the springs 74 and 79, and hence the springs 74 and 79 do not become hot. As a result, deterioration of the springs 74 and 79 can be prevented, whereby non-contact of the end portion of the connecting terminal 69*a* and the feeder rod 71 due to the deterioration of the spring 74 can be prevented, and non-contact of the end portion of the connecting terminal 69*b* and the feeder rod 76 due to the deterioration of the spring 79 can be prevented.

Moreover, in the present variation, the stages 73 and 78 and the movable connecting members 70 and 75 are also made of insulating material. Accordingly, the stages 73 and 78 and the movable connecting members 70 and 75 do not become hot, and hence deterioration of the stages 73 and 78 and the movable connecting members 70 and 75 can be prevented.

Moreover, in the plasma processing apparatus 1, a low pass filter (LPF) 61 through which the radio frequency electrical power from the upper radio frequency power source 31 (60 MHz) does not pass to ground but the radio frequency electrical power from the lower radio frequency power source 59 (2 MHz) does pass to ground is electrically connected to the inner upper electrode 24. The LPF 61 is preferably comprised of an LR filter or an LC filter. Note, however, that because sufficiently large reactance to the radio frequency electrical power from the upper radio frequency power source 31 can be conferred with one lead wire, instead of an LR filter or an LC filter, one lead wire may merely be electrically connected to the inner upper electrode 24. Meanwhile, a high pass filter (HPF) 62 for passing the radio frequency electrical power from the upper radio frequency power source 31 to ground is electrically connected to the susceptor 13.

Figure 5:
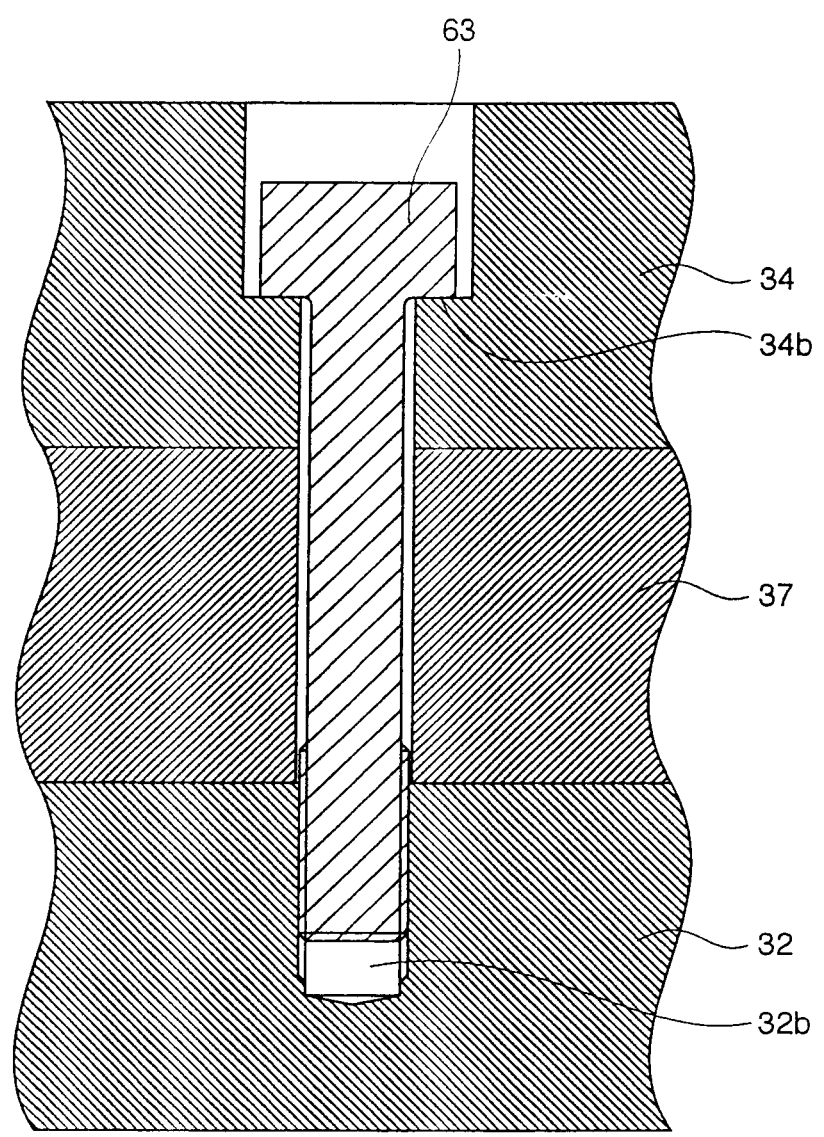
FIG. 5 is a sectional view showing a structure whereby a C/P, the spacer, and an upper electrode plate are fastened together by bolts.

Moreover, for the inner upper electrode 24, the C/P 34, the spacer 37, and the upper electrode plate 32 are fastened together by bolts 63 made of a conductor such as SUS as shown in FIG. 5. Here, at a bolt seating surface 34*b* in the C/P 34 where a head of each bolt 63 contacts the C/P 34, there is no alumite (insulating film) covering the surface of the C/P 34, but rather the aluminum of the C/P 34 is exposed, whereby there is electrical continuity between the C/P 34 and the bolt 63. Meanwhile, the upper electrode plate 32, which is made of a semiconductor material, has therein screw holes 32*b* into each of which is screwed a screw thread of a corresponding one of the bolts 63. Each bolt 63 is screwed into the corresponding screw hole 32*b*, whereby there is electrical continuity between the upper electrode plate 32 and the bolt 63. There is thus electrical continuity between the C/P 34 and the upper electrode plate 32 via the bolts 63.

With a conventional plasma processing apparatus, there is no electrical continuity between the cooling plate and the upper electrode plate, and hence upon the etching being carried out repeatedly, the upper electrode plate becomes charged, so that a potential difference arises between the upper electrode plate and the cooling plate, and moreover an electric field is produced in the gas-passing holes in the upper electrode plate. Ions that infiltrate into the gas-passing holes in the upper electrode plate are activated by this electric field, and hence the ions infiltrate into the gas-passing holes in the cooling plate. In the present embodiment, in response to this, there is made to be electrical continuity between the C/P 34 and the upper electrode plate 32 as described above.

In the present embodiment, the C/P 34, the spacer 37, and the upper electrode plate 32 are fastened together by the bolts 63 in six places. However, to obtain the electrical continuity between the C/P 34 and the upper electrode plate 32, any number of the bolts 63 from one upwards may be used.

Figure 6:
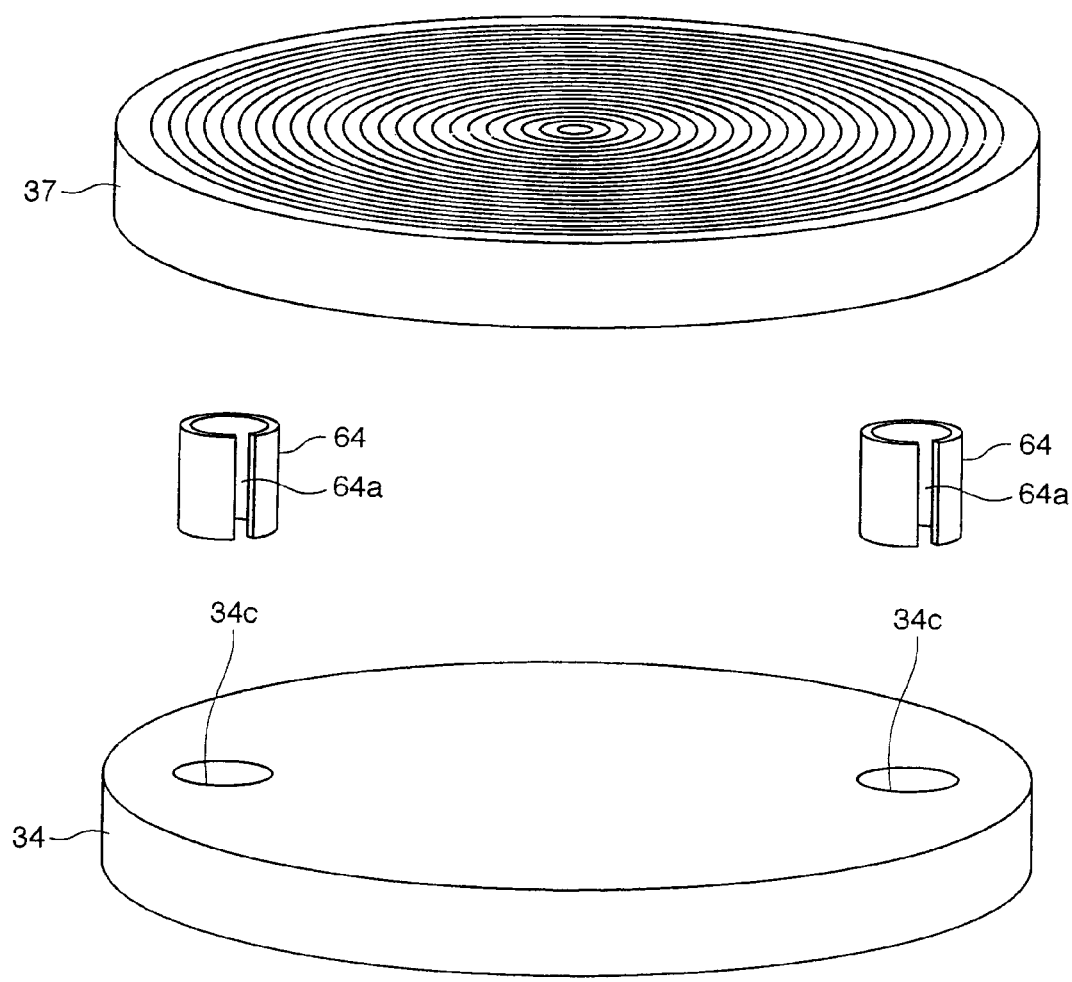
FIG. 6 is a perspective view showing a method of positioning the spacer and the C/P using positioning pins.

For the inner upper electrode 24, when carrying out replacement of the upper electrode assembly comprised of the upper electrode plate 32, the spacer 37, the C/P 34, and the electrode support 33, first the new upper electrode plate 32 (with which the old upper electrode plate 32 should be replaced), spacer 37, C/P 34, and electrode support 33 must be assembled together. At this time, as shown in FIG. 6, positioning of the spacer 37 and the C/P 34 are carried out using two cylindrical tubular positioning pins 64. Specifically, the positioning pins 64 are inserted into positioning pin holes 34*c* that open out in a surface of the C/P 34, which is placed upside-down, facing the spacer 37, and then the spacer 37 is mounted on the C/P 34 such that the positioning pins 64 projecting out from the C/P 34 are inserted into positioning pin holes (not shown) that open out in a surface of the spacer 37 facing the C/P 34. Note that in FIG. 6, the C/P gas-passing holes 34*a* in the C/P 34 have been omitted from the drawing.

Each of the positioning pins 64 has therein a slit 64*a* that penetrates through a side of the positioning pin 64 in a vertical direction, whereby the positioning pin 64 has a C-shaped cross section. Moreover, the positioning pins 64 are made of a resin material such as Cerazole (registered trademark).

In a conventional plasma processing apparatus, the positioning of the cooling plate and the upper electrode plate has been carried out using rod-shaped positioning pins, but upon carrying out the etching repeatedly, the positioning pins undergo thermal expansion, and hence cracks starting at the positioning pin holes arise in the upper electrode plate. In the present embodiment, in response to this, each of the positioning pins 64 is constituted from a hollow cylinder provided with a vertically penetrating slit 64a as described above. As a result, thermal expansion is absorbed by the slit 64a.

In the present embodiment, a resin is used as the material of the positioning pins 64, but so long as the material is elastic, any other material such as a metal may be used.

Figure 7:
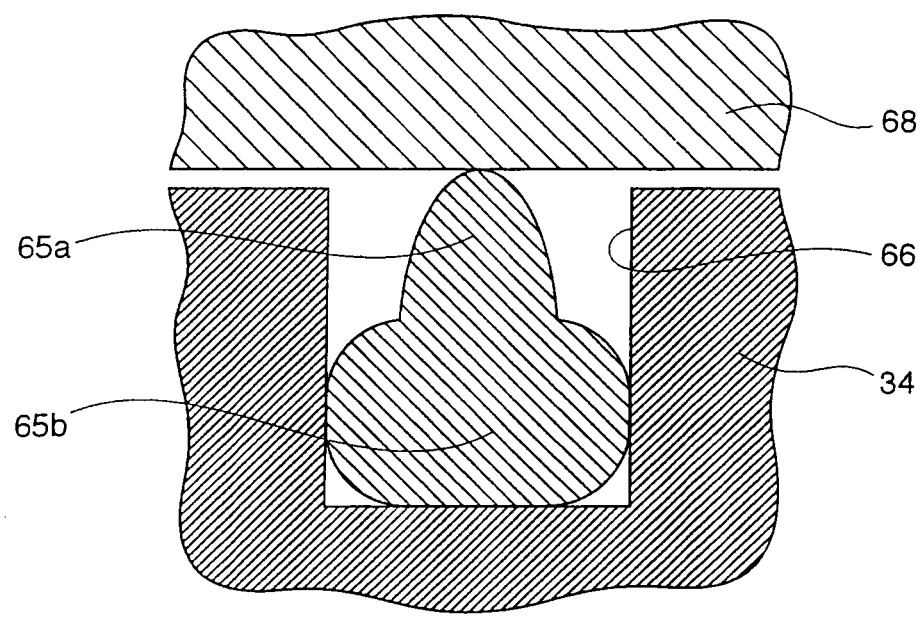
FIG. 7 is a sectional view showing an O-ring that is disposed between a chamber lid and the C/P.

Moreover, for the inner upper electrode 24, the upper electrode assembly is covered by a chamber lid 68 provided in an upper surface of the chamber 10. Here, as shown in FIG. 7, an O-ring 65 is disposed between the chamber lid 68 and the C/P 34. The O-ring 65 is comprised of a broad lower portion 65b and a narrow upper portion 65a. The O-ring 65 is compressed and housed in an O-ring housing groove 66 provided in an upper surface of the C/P 34.

In a conventional plasma processing apparatus, the O-ring has a circular cross section, and hence when the upper electrode assembly is covered by the chamber lid, the area of contact between the O-ring and the chamber lid is high, and thus the O-ring sticks to the chamber lid. As a result, when the chamber lid is opened to replace the upper electrode assembly, the cooling plate is lifted up together with the chamber lid. In the present embodiment, in response to this, the width of the upper portion 65a of the O-ring 65 that contacts the chamber lid 68 is made to be narrow, whereby the area of contact between the O-ring 65 and the chamber lid 68 is reduced. The O-ring 65 can thus be prevented from sticking to the chamber lid 68, and hence lifting up of the C/P 34 can be prevented.

In the plasma processing apparatus 1, to carry out the etching, first the gate valve 52 is opened, and a semiconductor wafer W to be processed is transferred into the chamber 10, and mounted on the susceptor 13. The processing gas, for example a mixed gas of $C_4F_8$ gas and argon (Ar) gas is then introduced at a predetermined flow rate and with a predetermined flow rate ratio between the components thereof from the processing gas supply source 38 into the central buffer chamber 35 and the peripheral buffer chamber 36, and the pressure in the plasma production space S in the chamber 10 is set to a value suitable for the etching, for example any value in a range of a few mTorr to 1 Torr, using the APC valve 48 and the TMP 49.

Furthermore, radio frequency electrical power (60 MHz) for plasma production is applied at a predetermined power to the upper electrode 22 (the outer upper electrode 23 and the inner upper electrode 24) by the upper radio frequency power source 31, and moreover radio frequency electrical power (2 MHz) for the etching, specifically reactive ion etching, is applied at a predetermined power to the susceptor 13 by the lower radio frequency power source 59. A DC voltage is also applied to the lower electrode plate 15 of the electrostatic chuck 14 by the DC power source 16, thus electrostatically attracting the semiconductor wafer W to the susceptor 13.

Next, the processing gas discharged from the central shower head and the peripheral shower head turns into plasma in a glow discharge between the upper electrode 22 and the susceptor 13, and hence a surface to be processed of the semiconductor wafer W is physically and chemically etched by radicals and ions produced at this time.

In the plasma processing apparatus 1, radio frequency electrical power in a high frequency region (at least 5 to 10 MHz so that ions do not move) is applied to the upper electrode 22, whereby the plasma is made to be of high density in a preferable dissociated state. High density plasma can thus be formed even under low pressure conditions.

Moreover, as described above, for the inner upper electrode 24, the ratio of the flow rates of discharge of the processing gas for the central shower head and the peripheral shower head facing the semiconductor wafer W electrostatically attracted to the susceptor 13 can be adjusted as desired. As a result, the spatial distribution of the density of gas molecules or radicals can be controlled in the radial direction of the semiconductor wafer W, and hence the spatial distribution of the etching characteristics based on the radicals can be controlled as desired.

Meanwhile, for the upper electrode 22, taking the outer upper electrode 23 as the major radio frequency electrode for plasma production, and the inner upper electrode 24 as auxiliary, the ratio between the outer upper electrode 23 and the inner upper electrode 24 of the electric field strength applied to electrons directly below the upper electrode 22 can be adjusted using the upper radio frequency power source 31 and the lower radio frequency power source 59. The spatial distribution of the ion density can thus be controlled in the radial direction, and hence the spatial characteristics of the reactive ion etching can be precisely controlled as desired.

Here, the control of the spatial distribution of the ion density, which is carried out by changing the ratio between the outer upper electrode 23 and the inner upper electrode 24 of the electric field strength or the applied electrical power, substantially does not affect the control of the spatial distribution of the radical density, which is carried out by changing the ratio between the central shower head and the peripheral shower head of the flow rate of the processing gas or the gas density or the gas mixing ratio. Specifically, dissociation of the processing gas discharged from the central shower head and the peripheral shower head takes place in an area directly below the inner upper electrode 24, and hence even if the balance of the electric field strength between the outer upper electrode 23 and the inner upper electrode 24 is changed, there will be hardly any effect on the balance of the radical production amount or density between the central shower head and the peripheral shower head, which are both within the inner upper electrode 24 (i.e. within the same area). For the plasma processing apparatus 1, the spatial distribution of the ion density and the spatial distribution of the radical density can thus be controlled substantially independently from one another.

Moreover, for the plasma processing apparatus 1, the majority of the plasma is produced directly below the outer upper electrode 23 and then diffuses to directly below the inner upper electrode 24. For the inner upper electrode 24, there is thus little attack from ions in the plasma, and hence wearing down of the gas-passing holes 32a in the upper electrode plate 32 can be suppressed effectively, and thus the replacement lifetime of the upper electrode assembly can be greatly extended.

Meanwhile, there are no gas discharge holes in the outer upper electrode 23, and hence wearing down of the outer upper electrode 23 caused by attack thereof by ions hardly occurs. It is thus not the case that there is a shortening of the replacement lifetime of the outer upper electrode 23 in lieu of the inner upper electrode 24.

According to the plasma processing apparatus 1 described above, in the upper electrode assembly comprised of the upper electrode plate 32, the spacer 37, the C/P 34, and the electrode support 33, the spacer gas-passing holes 37a, the electrode plate gas-passing holes 32a, and the C/P gas-passing holes 34a are not disposed collinearly with one another, and thus form a labyrinth. Consequently, ions that have infiltrated into the electrode plate gas-passing holes 32a can be made to lose energy through collisions with walls of the electrode plate gas-passing holes 32a and walls of the spacer gas-passing holes 37a, whereby the ions that have infiltrated into the electrode plate gas-passing holes 32a can be reliably prevented from infiltrating into the C/P gas-passing holes 34a. As a result, the upper electrode plate 32 can be prevented from being damaged due to abnormal electrical discharges caused by ions infiltrating into the C/P gas-passing holes 34a, and moreover there is no need to insert inserted members into the electrode plate gas-passing holes 32a for preventing infiltration of ions into the spacer gas-passing holes 37a, and hence an increase in the number of parts can be prevented so that a worsening of the ability to carry out maintenance can be prevented.

Moreover, even if the electrode plate gas-passing holes 32a in the upper electrode plate 32 are worn down, infiltration of ions into the C/P gas-passing holes 34a can be prevented, and hence the replacement lifetime of the upper electrode plate 32, and thus the replacement lifetime of the upper electrode assembly, can be greatly extended. Note also that the spacer 37 is present solely for forming the labyrinth, and hence there is generally no need to replace the spacer 37 even if the spacer 37 is worn down.

According to the plasma processing apparatus 1 described above, the spacer gas channels include the upper surface annular grooves 37b formed in the upper surface of the spacer 37 and the lower surface annular grooves 37c formed in the lower surface of the spacer 37. As a result, in the spacer gas channels, ions that have infiltrated into the electrode plate gas-passing holes 32a are led into the lower surface annular grooves 37c and the upper surface annular grooves 37b, and can thus be made to lose energy reliably through collisions with the lower surface of the spacer 37, the surface of the C/P 34, and walls of the lower surface annular grooves 37c and the upper surface annular grooves 37b. The ions that have infiltrated into the electrode plate gas-passing holes 32a can thus be more reliably prevented from infiltrating into the C/P gas-passing holes 34a.

The grooves formed in the upper surface and/or the lower surface of the spacer 37 are not limited to being annular grooves, but rather may be any grooves that enable a labyrinth to be formed from the grooves together with the C/P gas-passing holes 34a, the spacer gas-passing holes 37a, and the electrode plate gas-passing holes 32a in the central shower head and the peripheral shower head.

Moreover, according to the plasma processing apparatus 1 described above, the conductance for the central shower head and the peripheral shower head comprised of the electrode plate gas-passing holes 32a, the C/P gas-passing holes 34a, and the spacer gas channels is in a range of $6.9 \times 10^5$ to $2.1 \times 10^6$. As a result, the conductance is substantially the same as the conductance for the gas-passing holes in the upper electrode plate and the gas-passing holes in the cooling plate in a conventional plasma processing apparatus. The efficiency of supply of the processing gas can thus be maintained at substantially the same level as in a conventional plasma processing apparatus, and hence the efficiency of the etching can be prevented from decreasing.

Furthermore, according to the plasma processing apparatus 1 described above, there is electrical continuity between the upper electrode plate 32 and the C/P 34. As a result, the upper electrode plate 32 can be prevented from becoming charged, and hence an electric field can be prevented from being produced in the electrode plate gas-passing holes 32a. Ions that have infiltrated into the electrode plate gas-passing holes 32a can thus be prevented from being activated by such an electric field, and hence can be prevented from infiltrating into the C/P gas-passing holes 34a.

In the plasma processing apparatus 1 described above, there may be made to be electrical continuity between not only the upper electrode plate 32 and the C/P 34, but also the C/P 34 and the spacer 37. As a result, an electric field can be prevented from being produced in the spacer gas-passing holes 37a, and hence ions that have infiltrated into the spacer gas-passing holes 37a can be prevented from being activated.

The electrical continuity between the upper electrode plate 32 and the C/P 34 may alternatively be obtained by making there be no alumite on the C/P 34 at a contact surface between the C/P 34 and the spacer 37, and forming a silicon film by thermal spraying at this contact surface, and making the silicon film directly contact the spacer 37, and furthermore making the spacer 37 directly contact the upper electrode plate 32.

Moreover, according to the plasma processing apparatus 1 described above, each of the cylindrical tubular positioning pins 64 for carrying out positioning of the C/P 34 and the spacer 37 has a C-shaped cross section, having therein a slit 64a that penetrates through the side of the positioning pin 64 in a vertical direction. As a result, thermal expansion of the positioning pins 64 can be absorbed, and hence the spacer 37 can be prevented from being damaged.

Moreover, each of the positioning pins 64 can flexibly deform when subjected to a sideways stress, acting as a spring. As a result, when assembling the spacer 37 onto the C/P 34, if misalignment of the spacer 37 relative to the C/P 34 arises, i.e. if the positioning pins 64 are subjected to a sideways stress, then the spacer 37 will be moved relative to the C/P 34 so as to eliminate the misalignment.

Positioning pins having a similar structure to the positioning pins 64 may also be applied to the assembly of the spacer 37 and the upper electrode plate 32, whereby the upper electrode plate 32 can be prevented from being damaged.

In the plasma processing apparatus 1 described above, the upper electrode plate 32 and the spacer 37 are both made of silicon or silicon carbide. However, it is not necessary for the upper electrode plate 32 and the spacer 37 to be made of the same material, but rather either the upper electrode plate 32 or the spacer 37 may be made of a semiconductor or an insulator. In particular, the spacer 37 is not exposed to the plasma directly, and hence may be made, for example, of a ceramic or resin material.

A plasma processing apparatus according to a second embodiment of the present invention will now be described.

The present embodiment is basically the same as the above first embodiment in terms of construction and operation, differing from the first embodiment only in that the spacer is made of a porous material. Description of features of the construction and operation of the plasma processing apparatus that are the same as in the first embodiment will thus be omitted here, with only features of the construction and operation that are different to in the first embodiment being described.

Figure 8:
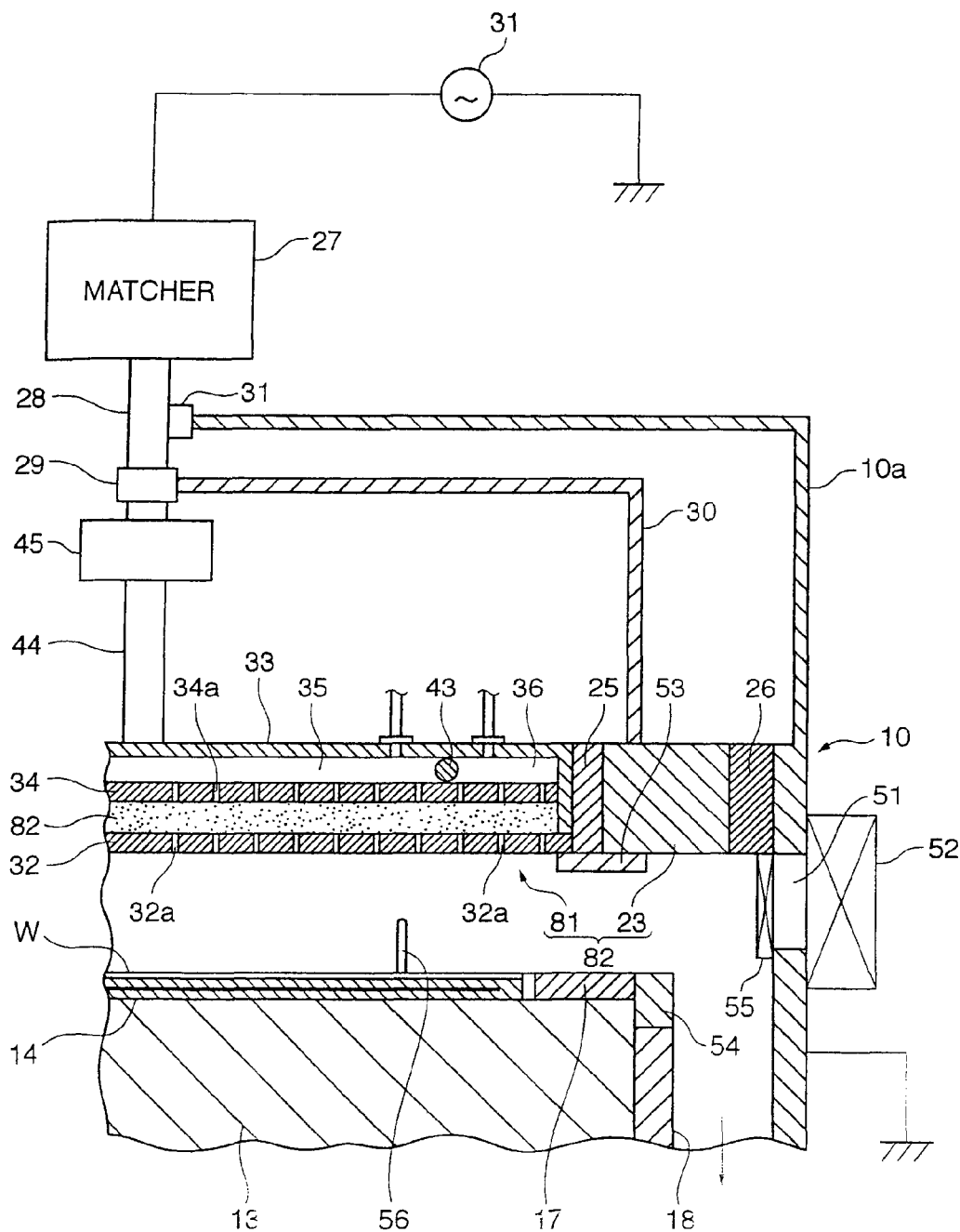
FIG. 8 is an enlarged sectional view schematically showing the construction of an upper electrode and vicinity thereof in a plasma processing apparatus according to a second embodiment of the present invention.

FIG. 8 is an enlarged sectional view schematically showing the construction of the upper electrode and the vicinity thereof in the plasma processing apparatus according to the present embodiment.

As shown in FIG. 8, the plasma processing apparatus 80 has an upper electrode 82 comprised of the annular or donut-shaped outer upper electrode 23 disposed facing the susceptor 13 with a predetermined gap therebetween, and a disk-shaped inner upper electrode 81 disposed insulated from the outer upper electrode 23 on the inside of the outer upper electrode 23 in a radial direction. The inner upper electrode 81 is comprised of an upper electrode assembly comprised of the upper electrode plate 32, the C/P 34, a porous spacer 83 interposed between the upper electrode plate 32 and the C/P 34, and the electrode support 33.

The porous spacer 83 is constituted from a porous material made of a semiconductor such as silicon or silicon carbide, or an insulator. The porous spacer 83 allows permeation therethrough into the electrode plate gas-passing holes 32a in the upper electrode plate 32 of the processing gas discharged from the C/P gas-passing holes 34a in the C/P 34. Moreover, the porous spacer 83 traps ions that have infiltrated into the electrode plate gas-passing holes 32a, causing the ions to collide, for example, with walls of pores in the porous material so that the ions lose energy.

According to the above plasma processing apparatus 80, the porous spacer 83 interposed between the upper electrode plate 32 and the C/P 34 is made of a porous material. As a result, ions that have infiltrated into the electrode plate gas-passing holes 32a can be made to lose energy through collisions with walls of pores in the porous material, whereby the ions that have infiltrated into the electrode plate gas-passing holes 32a can be reliably prevented from infiltrating into the C/P gas-passing holes 34a. As a result, the upper electrode plate 32 can be prevented from being damaged due to abnormal electrical discharges caused by ions infiltrating into the C/P gas-passing holes 34a.

In the present invention, there is no limitation to the plasma etching apparatus described above, but rather the present invention can also be applied to a plasma processing apparatus that subjects substrates to plasma processing such as CVD, plasma oxidation, plasma nitriding, or sputtering, and an upper electrode assembly of the plasma processing apparatus.

Moreover, the substrates subjected to the plasma processing in the present invention are not limited to being semiconductor wafers, but rather may be any of various substrates used in LCDs (liquid crystal displays), FPDs (flat panel displays) or the like, or photomasks, CD substrates, printed substrates, or the like.

What is claimed is:

1. An electrode structure having an electrostatic chuck disposed on an upper surface of a susceptor, the electrostatic chuck including an electrode plate and a pair of insulating layers that sandwich the electrode plate, a DC power source being connected to the electrode plate via a movable connecting member and a connecting terminal, the electrode structure comprising:
a feeder tube connected to the susceptor, the feeder tube constructed by an inner tube and an outer tube, the inner tube functioning as a supply path which supplies radio frequency electrical power to the susceptor, the outer tube functioning as a return path through which the radio frequency electrical power returns from the susceptor, the movable connecting member housed in an inner space of the inner tube of the feeder tube, wherein
the connecting terminal is connected to the electrode plate while penetrating through the susceptor,
the movable connecting member has therein a feeder rod made of conductive material,
in the inner space of the inner tube, an insulating material coil spring houses therein and supports the movable connecting member so that the feeder rod moves together with the movable connecting member integrally,
a connecting terminal side end of the feeder rod is exposed,
another end of the feeder rod is connected to the DC power source,
the movable connecting member is pushed to the connecting terminal by the insulating material coil spring thereby ensuring contact of the connecting terminal and the feeder rod so that a DC voltage is stably applied to the electrode plate.

2. The electrode structure as claimed in claim 1, wherein
the insulating material coil spring is disposed between a flange of the movable connecting member and a stage rigidly disposed in the inner space of the feeder tube.

3. A plasma processing apparatus comprising:
a processing chamber in which a substrate is housed;
a lower electrode disposed in the processing chamber, the lower electrode mounting the substrate thereon;
an electrode assembly facing the lower electrode in the processing chamber, the electrode assembly functioning as an upper electrode; and
a processing gas supply device that supplies a processing gas into the processing chamber, wherein
an electrostatic chuck is disposed on an upper surface of the lower electrode, the electrostatic chuck including an electrode plate and a pair of insulating layers that sandwich the electrode plate,
a feeder tube is connected to the lower electrode, the feeder tube being constructed by an inner tube and an outer tube, the inner tube functioning as a supply path which supplies radio frequency electrical power to the lower electrode, the outer tube functioning as a return path through which the radio frequency electrical power returns from the lower electrode, the inner tube of the feeder tube housing a movable connecting member in an inner space thereof,
a connecting terminal is connected to the electrode plate while penetrating through the lower electrode,
the movable connecting member has therein a feeder rod made of conductive material,
in the inner space of the inner tube, an insulating material coil spring houses therein and supports the movable connecting member so that the feeder rod moves together with the movable connecting member integrally,
a connecting terminal side end of the feeder rod is exposed,
another end of the feeder rod is connected to a DC power source,
the movable connecting member is pushed to the connecting terminal by the insulating material coil spring thereby ensuring contact of the connecting terminal and the feeder rod so that a DC voltage is stably applied to the electrode plate.

4. The plasma processing apparatus as claimed in claim 3, wherein
the insulating material coil spring is disposed between a flange of the movable connecting member and a stage rigidly disposed in the inner space of the feeder tube.

5. A mounting stage which holds a substrate by electrostatic attraction comprising:

a lower electrode to which a radio frequency power source is connected;
an electrostatic chuck disposed on the lower electrode and holding the substrate by the electrostatic attraction;
an electrode plate disposed inside the electrostatic chuck; and
an electrode structure applying DC voltage to the electrode plate,
wherein the electrode structure has
a feeder tube connected to the lower electrode,
a connecting terminal connected to the electrode plate while penetrating through the lower electrode,
a movable feeder rod contacting the connecting terminal,
a movable connecting member which has therein the movable feeder rod, the movable connecting member moving together with the movable feeder rod integrally, and
an insulating material coil spring housing therein and supporting the movable connecting member to cause the movable connecting member move,
wherein
the feeder tube is constructed by an inner tube and an outer tube, the inner tube functions as a supply path which supplies radio frequency electrical power to the lower electrode, and the outer tube functions as a return path through which the radio frequency electrical power returns from the lower electrode,
the moveable connecting member is housed in an inner space of the inner tube of the feeder tube,
in the inner space of the inner tube, the insulating material coil spring houses therein and supports the movable connecting member so that the movable feeder rod moves together with the movable connecting member integrally,
a connecting terminal side end of the movable feeder rod is exposed,
another end of the movable feeder rod is connected to a DC power source, and
the movable connecting member is pushed to the connecting terminal by the insulating material coil spring thereby ensuring contact of the connecting terminal and the movable feeder rod so that the DC voltage is stably applied to the electrode plate.

6. The mounting stage as claimed in claim 5, wherein insulating material of the insulating material coil spring is silicon nitride or polyether ether ketone.

7. The mounting stage as claimed in claim 5, further comprising:
a lead wire connected to one end of the movable feeder rod;
another movable feeder rod connected to the lead wire; and
another spring disposed so as to surround the other movable feeder rod.

8. The mounting stage as claimed in claim 7, wherein the other spring is made of insulating material.

9. The electrode structure as claimed in claim 1, wherein insulating material of the insulating material coil spring is silicon nitride or polyether ether ketone.

10. The electrode structure as claimed in claim 1, further comprising:
a lead wire connected to one edge of the movable connecting member;
another movable connecting member connected to the lead wire; and
another spring disposed so as to surround the other movable connecting member.

11. The electrode structure as claimed in claim 10, wherein the other spring is made of insulating material.

12. The mounting stage as claimed in claim 7, wherein insulating material of the insulating material coil spring is silicon nitride or polyether ether ketone.

13. The mounting stage as claimed in claim 5, further comprising:
a lead wire connected to one end of the movable feeder rod;
another movable feeder rod connected to the lead wire; and
another spring disposed so as to surround the other movable feeder rod.

14. The mounting stage as claimed in claim 13, wherein the other spring is made of insulating material.

15. A plasma processing apparatus comprising:
a chamber housing a substrate;
a mounting stage disposed in the chamber and holding the substrate by electrostatic attraction; and
a gas supplying unit supplying a processing gas into the chamber,
wherein the mounting stage has
a lower electrode to which a radio frequency power source is connected;
an electrostatic chuck disposed on the lower electrode and holding the substrate by the electrostatic attraction;
an electrode plate disposed inside the electrostatic chuck; and
an electrode structure applying DC voltage to the electrode plate, and
wherein the electrode structure has
a feeder tube connected to the lower electrode,
a connecting terminal connected to the electrode plate while penetrating through the lower electrode,
a movable feeder rod contacting the connecting terminal,
a movable connecting member which has therein the movable feeder rod, the movable connecting member moving together with the movable feeder rod integrally, and
an insulating material coil spring housing therein and supporting the movable connecting member to cause the movable connecting member move,
wherein
the feeder tube is constructed by an inner tube and an outer tube, the inner tube functions as a supply path which supplies radio frequency electrical power to the lower electrode, and the outer tube functions as a return path through which the radio frequency electrical power returns from the lower electrode,
the movable connecting member is housed in an inner space of the inner tube of the feeder tube,
in the inner space of the inner tube, the insulating material coil spring houses therein and supports the moveable connecting member so that the movable feeder rod moves together with the movable connecting member integrally,
a connecting terminal side end of the movable feeder rod is exposed,
another end of the movable feeder rod is connected to a DC power source, and
the movable connecting member is pushed to the connecting terminal by the insulating material coil spring thereby ensuring contact of the connecting terminal and the movable feeder rod so that the DC voltage is stably applied to the electrode plate.

16. The plasma processing apparatus as claimed in claim 15, wherein insulating material of the insulating material coil spring is silicon nitride or polyether ether ketone.

17. The plasma processing apparatus as claimed in claim 15, further comprising:
 a lead wire connected to one end of the movable feeder rod;
 another movable feeder rod connected to the lead wire; and
 another spring disposed so as to surround the other movable feeder rod.

18. The plasma processing apparatus as claimed in claim 17, wherein the other spring is made of insulating material.

* * * * *